US012002837B2

(12) United States Patent
Oh et al.

(10) Patent No.: US 12,002,837 B2
(45) Date of Patent: Jun. 4, 2024

(54) IMAGING SENSOR WITH NEAR-INFRARED ABSORBER

(71) Applicant: Microsoft Technology Licensing, LLC, Redmond, WA (US)

(72) Inventors: Minseok Oh, Santa Clara, CA (US); Satyadev Hulikal Nagaraja, San Jose, CA (US); Cyrus Soli Bamji, Fremont, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 196 days.

(21) Appl. No.: 17/358,326

(22) Filed: Jun. 25, 2021

(65) Prior Publication Data

US 2022/0415957 A1 Dec. 29, 2022

(51) Int. Cl.
*H01L 27/146* (2006.01)
*H04N 23/11* (2023.01)

(52) U.S. Cl.
CPC .. *H01L 27/14649* (2013.01); *H01L 27/14605* (2013.01); *H01L 27/14607* (2013.01); *H04N 23/11* (2023.01)

(58) Field of Classification Search
None
See application file for complete search history.

(56) References Cited

U.S. PATENT DOCUMENTS 10,165,211 B1 * 12/2018 Borthakur ............ H04N 25/702
11,588,982 B2 * 2/2023 Oh ..................... H01L 27/1461
2002/0101532 A1 * 8/2002 Takayama ............ H04N 25/702
  348/E5.037
2008/0056707 A1 * 3/2008 Ovsiannikov ..... H01L 27/14625
  396/375
2010/0007775 A1 * 1/2010 Wang ..................... H04N 25/63
  348/241
2013/0113968 A1 * 5/2013 Lenchenkov ....... H01L 27/1464
  257/447
2014/0014818 A1 * 1/2014 Cho ................. H01L 27/14601
  257/435
2014/0027611 A1 * 1/2014 Patel .................... H04N 25/673
  250/208.1

(Continued)

OTHER PUBLICATIONS

"Invitation to Pay Additional Fees Issued in PCT Application No. PCT/US22/029095", Mailed Date: Aug. 10, 2022, 10 Pages.

(Continued)

*Primary Examiner* — Reza Aghevli
(74) *Attorney, Agent, or Firm* — Alleman Hall & Tuttle LLP

(57) ABSTRACT

An example imaging sensor comprises a bulk silicon substrate and a pixel array. The pixel array comprises an active pixel region including an active pixel subarray, an optical black pixel region including an optical black pixel subarray, and an optical black dummy pixel region including an optical black dummy pixel subarray, the optical black dummy pixel region positioned between the active pixel region and the optical black pixel region. A near-infrared absorber is positioned between the active pixel region and the optical black pixel region, the near-infrared absorber comprising a material having a higher near-infrared absorption coefficient than that of silicon.

19 Claims, 11 Drawing Sheets

(56) References Cited

U.S. PATENT DOCUMENTS

| | | | |
|---|---|---|---|
| 2014/0152844 A1* | 6/2014 | Jiang | H04N 17/002 |
| | | | 348/187 |
| 2016/0315112 A1* | 10/2016 | Park | H01L 27/14623 |
| 2018/0255256 A1* | 9/2018 | Park | H04N 1/40012 |
| 2019/0132536 A1* | 5/2019 | Watanabe | H01L 27/14607 |
| 2019/0221597 A1* | 7/2019 | Noh | H01L 27/14605 |
| 2020/0092501 A1* | 3/2020 | Li | H04N 25/633 |
| 2020/0127030 A1* | 4/2020 | Ogawa | H01L 27/14627 |
| 2021/0044767 A1* | 2/2021 | Rajasekaran | H04N 23/741 |
| 2021/0133993 A1* | 5/2021 | Retterath | G06T 7/521 |
| 2021/0272988 A1* | 9/2021 | Chen | H01L 27/14683 |
| 2022/0239822 A1* | 7/2022 | Genov | G01S 17/894 |
| 2022/0337774 A1* | 10/2022 | Oh | H01L 27/14612 |

OTHER PUBLICATIONS

"International Search Report and Written Opinion Issued in PCT Application No. PCT/US22/029095", dated Oct. 6, 2016, 16 Pages.

* cited by examiner

IMAGING SENSOR WITH NEAR-INFRARED ABSORBER

BACKGROUND

Some imaging devices may be configured to obtain images over multiple ranges of light wavelengths. For example, depth cameras that use infrared light for depth imaging may also capture visible light images. Visible light cameras may also capture images in the near-infrared range. This may allow for matching depth information to color, black and white, and/or greyscale information for a scene, or for pairing low-light imagery with thermal imagery.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

In one disclosed example, an imaging sensor comprises a bulk silicon substrate and a pixel array. The pixel array comprises an active pixel region including an active pixel subarray, an optical black pixel region including an optical black pixel subarray, and an optical black dummy pixel region including an optical black dummy pixel subarray, the optical black dummy pixel region positioned between the active pixel region and the optical black pixel region. A near-infrared absorber is positioned between the active pixel region and the optical black pixel region, the near-infrared absorber comprising a material having a higher near-infrared absorption coefficient than a near-infrared absorption coefficient of silicon.

DETAILED DESCRIPTION

Figure 1:
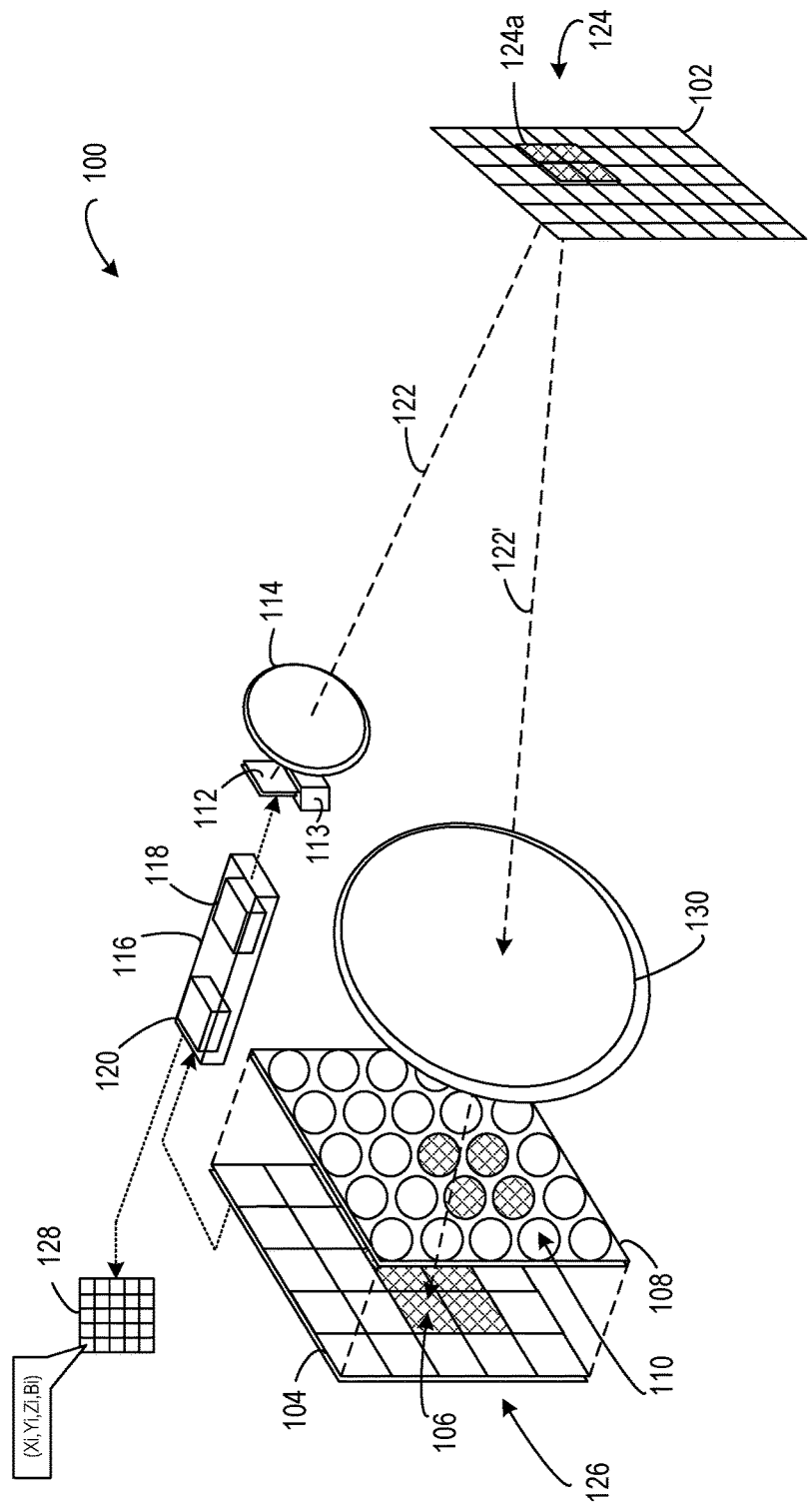
FIG. 1 schematically shows an example image sensor.

Silicon-based image sensors produce both a light-responsive current and some amount of dark current. The dark current produces a dark offset (e.g., noise) in the output signal for each pixel. This dark offset is generally subtracted from the output signal to leave only the light current.

Conventional complementary metal-oxide semiconductor (CMOS) image sensors have so-called optical black (OB) pixels positioned beneath a light shield on the peripheries of the pixel array. These pixels are effectively shielded from light and thus only produce dark current. This dark current is suitably consistent across active pixels and optical black pixels to allow the OB pixel signal to be used to effectively cancel out the dark offset of the active pixels.

However, this offset calculation assumes that there is no light leakage into the OB pixels, even under direct sunlight. If the OB pixels produce light current due to light leakage, the dark offset will be over-subtracted from the active pixel output signal. Silicon itself has a very low absorption coefficient in the near-infrared (near-IR) wavelengths (e.g. 535/cm at 850 nm). For conventional RGB cameras, a filter may be installed that blocks out infrared (IR) and near-infrared (near-IR) wavelengths. Extraneous visible light photons may be absorbed by the pixels and the bulk silicon over a short distance (e.g. 10 μm), and a minimal number of photons migrate to the OB pixels.

However, many emerging imaging applications aim to capture both near-IR/IR and visible light. For example, time-of-flight (ToF) sensors that are used to collect depth information for 3D imaging using IR light may also be used for 2D imaging. As such, filters that block near-IR and IR wavelengths are not a practical option in these imaging systems. A shutter may be employed that alternately blocks and exposes the pixels to the visible portion of the radiation band, but for simplicity, the IR portion is generally not filtered, and thus still reaches the pixel array even when visible light is being targeted for image capture. The relatively low absorption of silicon in these wavelengths means that near-IR and IR photons may drift into the OB pixel region without such filtering.

An OB dummy pixel region may be positioned under the light shield to provide lateral shielding and absorption of drifting photons to prevent these photons from reaching the OB pixels. However, IR and near-IR photons may penetrate 100 μm or more, necessitating a large OB dummy pixel region. This increases the die size of the sensor, increasing manufacturing costs. Further, a wider OB dummy pixel region means that the signal lines will be longer, leading to a higher resistive-capacitive delay, and thus a lower maximal frame rate.

Accordingly, examples are disclosed that enable the use of a relatively small optical black dummy region while reducing or eliminating near-IR light leakage into optical black pixels in an image sensor. In one example, a near-infrared absorber is positioned between the active pixel region and the optical black pixel region, the near-infrared absorber comprising a material having a higher near-infrared absorption coefficient than that of silicon, such as germanium, and thus being configured to absorb photons that penetrate beneath the light shield. Additionally or alternatively, a deep trench isolator (DTI) may extend between the optical black pixel region and the active pixel region, reflecting photons away from the OB pixels for absorption by silicon and/or the near-infrared absorber. Examples are also disclosed that relate to dark current mitigation in multi-tap pixels, such as indirect ToF pixels, whereby the dark signal of one tap of the pixel may be used for dark offset cancelation for the remaining tap(s).

FIG. 1 shows aspects of an example depth image sensor 100 comprising a ToF camera. The term 'camera' refers herein to any imaging component having at least one optical aperture and sensor array configured to image a scene 102 or subject. Depth image sensor 100 includes a sensor array 104 of individually addressable sensor pixels 106 integrated into a semiconductor die, such as a silicon die. In some implementations, the pixels may be complementary metal-oxide semiconductor (CMOS) elements, but other suitable architectures are also envisaged. Each pixel may be responsive to light over a broad wavelength band, although this is not required. Sensor array 104 is schematically illustrated with twenty-five individually addressable pixels 106 for simplicity, although any suitable number of pixels 106 may be used.

In some implementations, the pixels 106 of sensor array 104 may comprise differential pixels. Each differential pixel may include different collection terminals ("taps") that are energized according to different clock signals. In one example, to measure modulated illumination light using two taps, two clock signals that are substantially complementary (e.g., the two clock signals have 50% duty cycles that are 180 degrees out of phase) may be used to control the taps. In other examples, the two different clock signals may have a different relationship, such as for measuring ambient illumination or non-modulated active illumination.

In other camera implementations that do not include sensor arrays of differential pixels, additional clock cycles may be used to perform a differential measurement. While differential pixels can provide advantages, other types of sensor arrays, including non-differential sensor arrays, may be used.

Microlens array 108 optionally may be arranged over sensor array 104. Microlens array 108 includes a plurality of microlens elements 110. Each microlens element 110 of microlens array 108 may be registered to a pixel 106 of the sensor array 104. When included, microlens array 108 may provide a larger effective fill factor at each of the pixels, for increased collection efficiency and reduced cross-talk between pixels.

A ToF illuminator 112 is configured to selectively emit active light to illuminate the scene 102. In one example, ToF illuminator 112 includes an IR laser configured to emit IR light. In some examples, ToF illuminator 112 optionally may include a diffuser covering a field of illumination of ToF illuminator 112. Depth measurements may be taken using IR light, including near infrared (NIR) light, far infrared (FIR) light, or any other suitable wavelength. Although not shown in FIG. 1, the depth image sensor optionally may include a bandpass filter to limit the portion of the electromagnetic spectrum reaching the pixels 106 to the portion of the electromagnetic spectrum emitted by ToF illuminator 112.

In other examples, ToF illuminator 112 may be configured to emit active illumination light in a visible spectral band. In some examples, ToF illuminator 112 may include a broadband illumination source, such as a white light source. Further, in some examples, ToF illuminator 112 may include a plurality of spectral illuminators (e.g. LEDs). In some such examples, the plurality of spectral illuminators may be configured to emit active illumination in the same spectral band, although this is not required.

In some examples, ToF illuminator 112 comprises a steerable illumination source configured to selectively emit active illumination light having a narrow field that is sized to illuminate one or more illumination zones in the scene 102. Further, the steerable illumination source comprises a steering element 113 configured to steer the active illumination light 122 emitted from steerable illumination source to individually actively illuminate different illumination zones (e.g., zone 124a) of a plurality of target illumination zones 124 in scene 102 viewed by sensor array 104. Such a zoned arrangement produces an illumination light having a smaller angular extent than the field of view of sensor array 104, and thereby may provide a greater power density for the same peak power of the illumination relative to full-field imaging. An illumination zone may be configured to be any suitable size that is less than an entire field of view of the scene viewed by sensor array 104. Any suitable number of illumination zones may be used to collectively cover the field of view of the sensor array 104. Further, any suitable number of pixels of the sensor array may be mapped to each illumination zone. In other examples, a fixed, rather than steerable, illumination source may be used.

Electronic controller 116 may include a logic machine 118 and storage machine 120. The storage machine may hold instructions that cause the logic machine to enact any operation, algorithm, computation, or transformation disclosed herein. In some implementations, the logic machine may take the form of an application-specific integrated circuit (ASIC) or system-on-a-chip (SoC), in which some or all of the instructions are hardware- or firmware-encoded. Electronic controller 116 may be operatively connected to sensor array 104, ToF illuminator 112, and/or steering element 113. In some examples, electronic controller 116 includes a ToF controller machine and/or an output machine, which may be implemented as separate physical hardware and/or firmware components or incorporated into a single hardware and/or firmware component.

Electronic controller 116 is configured to repeatedly activate the ToF illuminator 112 and synchronously address the pixels 106 of sensor array 104 to acquire IR images. The active light signal emitted from ToF illuminator 112 may be temporally modulated in different modulation frequencies for different image captures. In the illustrated example, electronic controller 116 activates ToF illuminator 112 to illuminate scene 102 with modulated IR light 122 and addresses the pixels of sensor array 104 in synchronicity. IR light 122' reflects from the scene 102 back to the camera 100. The reflected IR light 122' passes through receiving optics and is incident on the pixels of sensor array 104 to provide a measurement. For example, the measurement may be an intensity measurement of active IR light back-reflected from the subject to the pixel. In the illustrated example, IR light 122' is measured by a pixel 106 of sensor array 104, thus providing phase information useable with the knowledge of the camera's configuration to determine the world space position of a locus of scene 102.

In some examples, electronic controller 116 controls steering element 113 to steer active light 122 towards illumination zone 124. As such, reflected light 122' from objects in illumination zone 124 passes through receiving optics, indicated schematically at 130, and is incident on pixels within a region of interest (ROI) 126. In some examples, ROI depth imaging can be performed across a plurality of illumination zones (e.g., by scanning through ROIs) to produce a full array depth image. In other examples, ROI depth imaging can be performed on demand where the ROI is identified via intensity changes in a mono or RGB camera image. Such an image may be acquired via a separate camera or via depth image sensor 100 operating in a passive mode, as examples.

Electronic controller 116 may be configured to individually control the pixels 106 of the sensor array 104 to selectively acquire different types of images (e.g., 2D, 3D) of at least a portion of the scene 102 viewed by the sensor array 104. Electronic controller 116 may be configured to control the sensor array 104 to acquire a full-field 2D image.

For example, electronic controller 116 may be configured to address all of the pixels 106 of sensor array 104 while ToF illuminator 112 is deactivated to acquire a 2D passive light image (e.g., monochrome or color image) of the scene 102.

The term 'address' as applied to pixels 106 of sensor array 104 may have a somewhat different meaning depending on the imaging mode described. For flat-imaging—for spectral light including both visible and IR light—addressing the pixels 106 may include integrating the intensity of ambient light received at each pixel 106 and associating the integrated intensity of the ambient light in the sub-band with the portion of the 2D image corresponding to that pixel.

For depth imaging, the pixels 106 may be addressed differently. Here, addressing the pixels may include resolving a phase offset from each pixel relative to the modulated intensity of the IR light. The phase offset, optionally converted into the depth domain, may be associated with the portion of the image corresponding to the pixel addressed. In other words, electronic controller 116 may be configured to determine a depth value for each pixel 106 of the sensor array 104 that is addressed. In some implementations, a series of IR image acquisitions (e.g., 6-9) in rapid succession may be used to obtain the phase offset. In combination 2D/3D imaging applications, both of the above addressing modes may be used in a time multiplexed manner.

Electronic controller 116 is configured to generate a depth image 128 based on a plurality of captured IR images. The term 'depth image' refers to an array of individually addressable image pixels registered to corresponding regions ($X_i$, $Y_i$) of an imaged scene, with a depth value $Z_i$ indicating, for each image pixel, the depth of the corresponding region. 'Depth' is defined as a coordinate parallel to the optical axis of the camera, which increases with increasing distance from the camera. The term 'depth video' can be used to refer to a time-resolved sequence of depth images. Electronic controller 116 is configured to output depth image 128. The quality of the depth determination may depend on the quantum efficiency (QE) of the image sensor, defined as the number of electrons generated per incident photon, and on the signal contrast between the taps, also known as demodulation contrast.

It will be understood that FIG. 1 is schematic, highly simplified, and provided for illustration only. The sizes, shapes, and positions of the various components depicted in FIG. 1 are non-limiting and are not intended to depict a real usage scenario. In practical applications, the depth camera system, image sensor, and individual pixels of the image sensor may each include any number of additional components not depicted in FIG. 1, and/or omit or replace some components shown in FIG. 1. In general, the depth camera system, along with any computing components included within the depth camera system, may have any suitable configuration, form factor, and capabilities.

Figure 2:
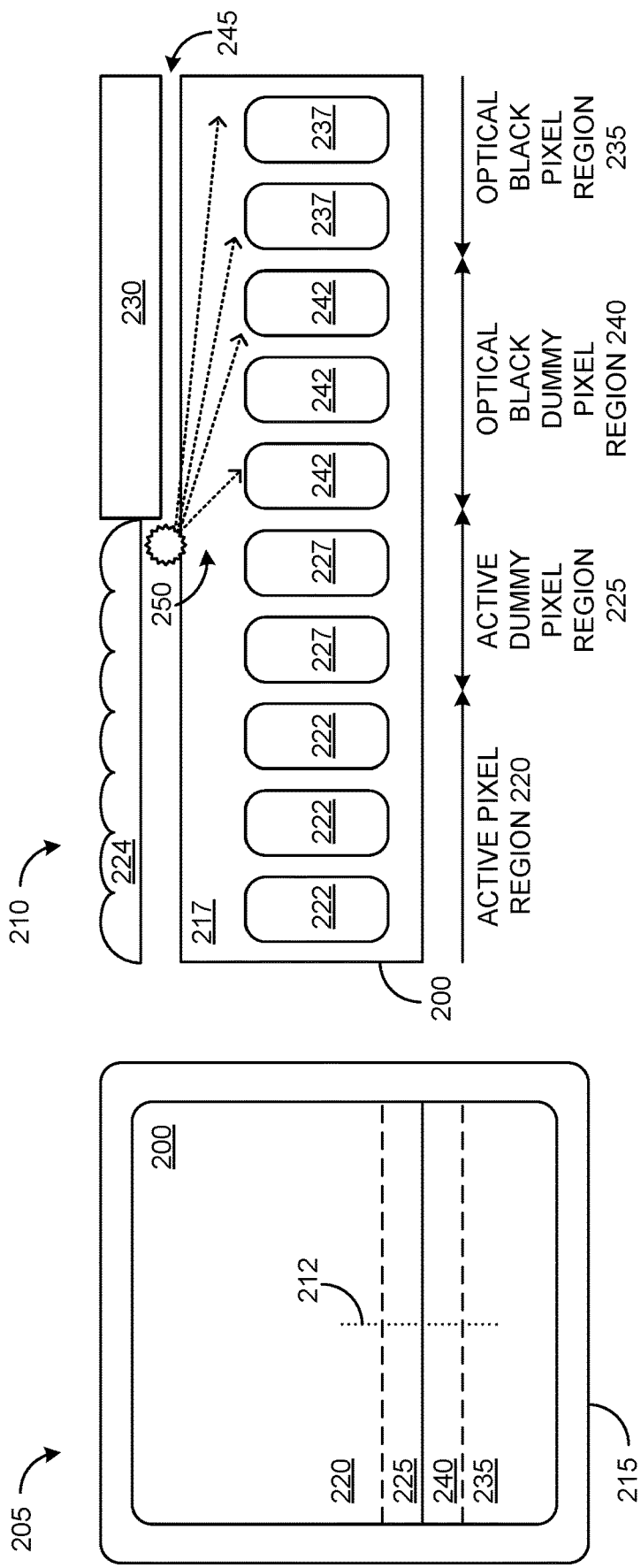
FIG. 2 schematically shows an example pixel array.

FIG. 2 shows an example pixel array 200 for a backside illumination CMOS image sensor (BSI-CIS) sensor. Pixel array 200 may be an example of sensor array 104. At 205, pixel array 200 is schematically shown from the backside. At 210, a cross section of pixel array 200 is shown, taken along dotted line 212. Pixel array 200 is not drawn to scale, and may include numerous components not shown in FIG. 2. Pixels of pixel array 200 may be photodiodes, photogates, or any other suitable photodetector.

At 205, pixel array 200 is shown positioned within one or more guard rings 215, which may comprise alternating N-wells that are biased at positive power supply voltage (e.g., VDD) and P-wells that are biased at ground. Guard rings 215 may thus offer electrical isolation of pixel array 200 from peripheral circuits. As shown at 210, pixels of pixel array 200 may be positioned in a bulk silicon substrate 217. In some examples, bulk silicon substrate 217 is p-doped, while the pixels of pixel array 200 may be either p-doped or n-doped. Other examples may have other configurations.

Pixel array 200 is divided into different functional regions. Active pixel region 220 includes a subarray of active pixels 222. Microlens array 224 may be arranged directly over active pixel region 220. An active dummy pixel region 225 is positioned adjacent to active pixel region 220, and beneath microlens array 224. Active dummy pixel region 225 includes a subarray of active dummy pixels 227. Active dummy pixels 227 act as a process margin for active pixels 222, as the output from pixels near opaque light shield 230 may not be reliable.

Light shield 230 is shown positioned over optical black pixel region 235 on the back side of pixel array 200. Optical black pixel region 235 includes a subarray of optical black pixels 237. An optical black dummy pixel region 240 includes a subarray of optical black dummy pixels 242, and is positioned adjacent to light shield 230 and between optical black pixel region 235 and active dummy pixel region 225. Optical black dummy pixel region 240 provides a margin for light absorption at the edge of light shield 230, to reduce the amount of photon drifting and the amount of diffusion of generated photoelectrons into optical black dummy pixel region 240.

Light shield 230 may comprise tungsten or any other suitable light blocking material. As tungsten is metallic, a small gap 245 (e.g., <1 μm) may be arranged between light shield 230 and bulk silicon substrate 217 to prevent diffusion of tungsten into the silicon and to prevent additional current from registering at optical black pixel region 237. Gap 245 may be filled with an oxide or other suitable material.

In such a configuration, active pixels 222 report both light current and dark current, while optical black pixels 237 only report dark current. The optical black signal can thus be subtracted from the active signal to determine light current. This assumes that there is no photocharge migration or light propagation into optical black pixel region 235. The optical black dummy pixel region is generally wide enough to effectively mitigate photocharge migration. However, as described herein, silicon has a relatively modest absorption of near-IR and IR light. As such, IR light, including near-IR light, may extend far into bulk silicon substrate 217, reaching optical black pixels 237, as shown at 250. Light passing through microlens array 224 may reach into gaps in pixel array 200, such as gap 245, reflect off any metal layers, and migrate beneath light shield 230.

Thus, to prevent such migration of IR light to optical black pixels 237, a near-infrared absorber may be positioned between the active pixel region and the optical black pixel region. Such a near-infrared absorber may comprise a material having a higher near-infrared absorption coefficient than that of silicon. In some examples, the near-infrared absorber may comprise germanium. In other examples, any other suitable material that is compatible with the process flow for backside illumination and CMOS architecture, the silicon fabrication process, the electrical carrier properties of silicon, and has a high absorptivity for near-infrared photons may be used, such as SiGe. Further, the continued development of silicon-based CMOS processes may allow for low bandgap materials (e.g., InGaAs, InSb, organic materials) to be used as near-infrared absorbers.

As used herein, "near-infrared" or "near-IR" refers to light wavelengths approximately between the visible wavelengths (700 nm) and 1450 nm. A material having a higher near-infrared absorption coefficient than silicon may not necessarily absorb light more effectively than silicon over this entire range of wavelengths. Depending on the desired absorption spectrum for active pixels (e.g., which IR wavelength is used for ToF detection), the near-infrared absorber may have a higher near-infrared absorption coefficient for a specific range of wavelengths, above which a filter may be used to deflect or absorb IR light. Notably, the absorption of silicon decreases dramatically above 1000-1100 nm, and few photoelectrons are generated, over the absorption depth of silicon suitable for inclusion in a pixel array. As such, the near-IR wavelengths between 700 and 1000-1100 nm are targeted for absorption and neutralization. However, many materials having a higher near-infrared absorption coefficient than silicon between 700 and 1100 nm also absorb light more effectively than silicon from 1100-1400 nm.

FIGS. 3A-3D schematically show cross-sections for example pixel arrays for BSI-CIS sensors including a near-infrared absorber. Components and regions having similar structures and functions as related components and regions described with regard to FIG. 2 are labeled with similar numbering.

Figure 3A:
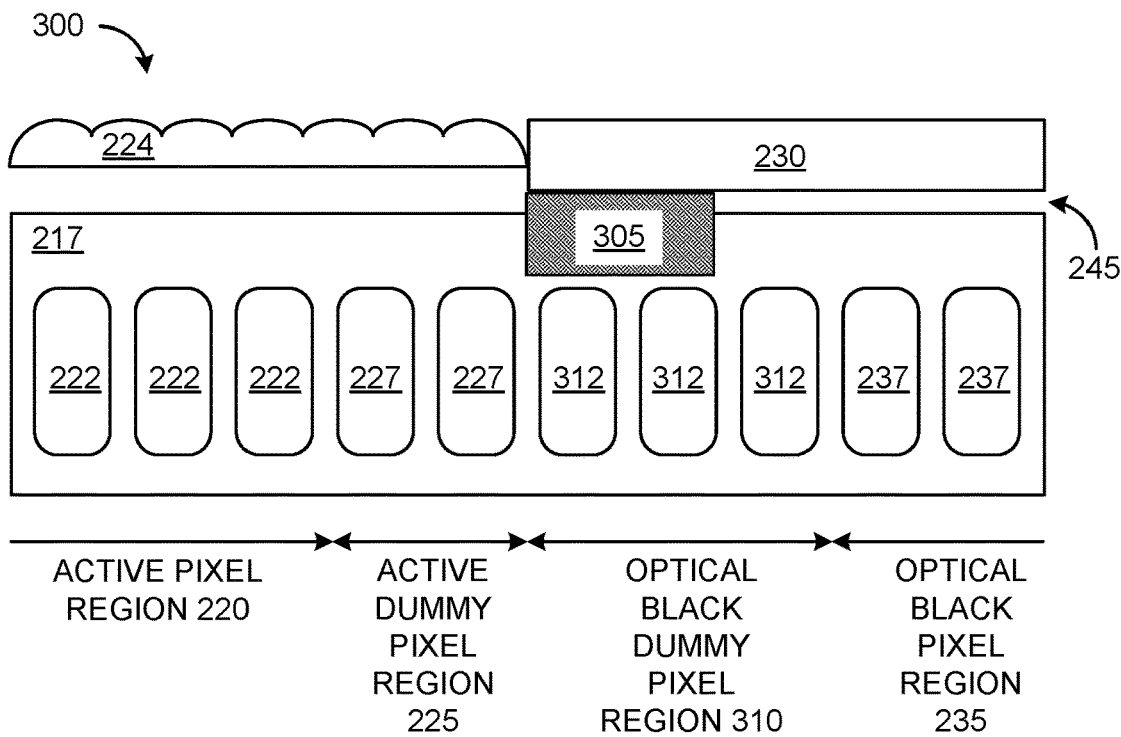
FIGS. 3A-3B schematically show example pixel arrays including a near-infrared absorber.
Figure 3B:
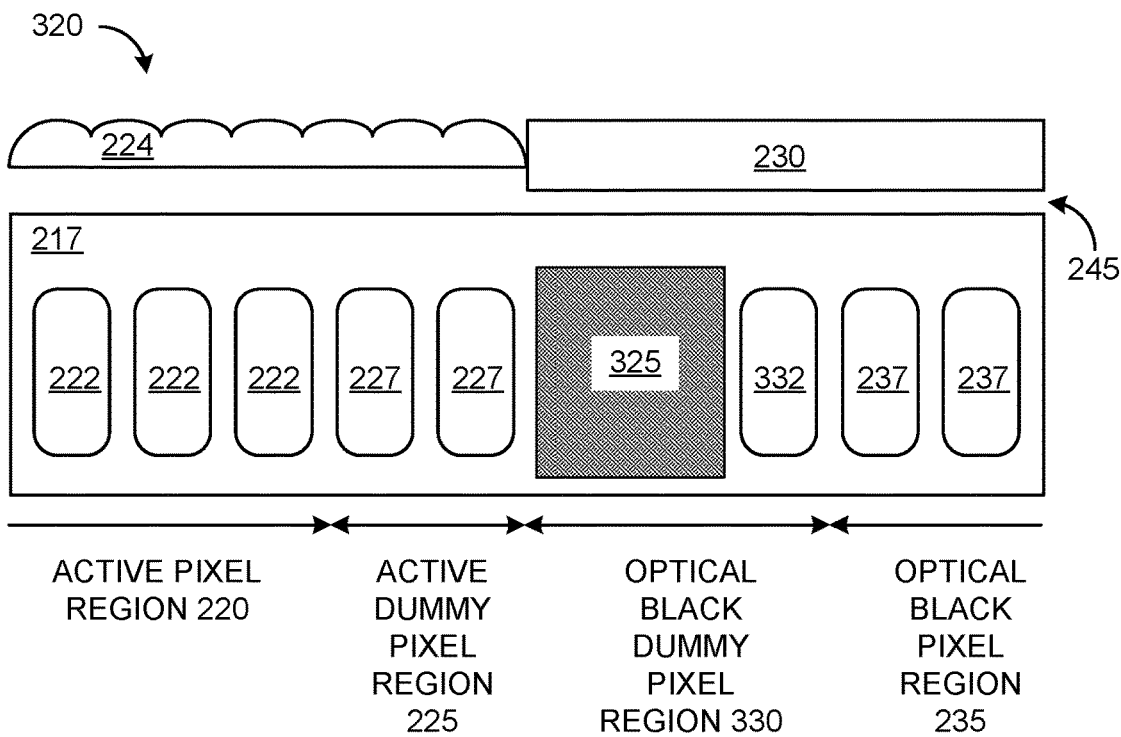

In some examples, the near-infrared absorber may be positioned within and/or overlapping a border of the optical black dummy region. For example, FIG. 3A schematically shows a cross-section of an example pixel array 300 including a near-infrared absorber 305 added to the backside of optical black dummy pixel region 310, situated between optical black dummy pixels 312 and opaque light shield 230. In FIG. 3B, pixel array 320 includes a near-infrared absorber 325 that is positioned within optical black dummy pixel region 330 so as to be integrated among optical black dummy pixels 332, effectively replacing one or more optical black dummy pixels 332. The positioning of near-infrared absorber 325 is also applicable to full-spectral imaging array structures. The absorber configuration of pixel array 320 could potentially be deeper, e.g., trenched from the backside of pixel array 320, and thus more effective at absorbing light. However, the configuration shown at 300 in FIG. 3A may be simpler to fabricate and may provide adequate photon absorption for many applications. In either of these examples, or any other example, a significant number of photons that may otherwise migrate under light shield 230 towards optical black pixels 237 may be absorbed.

Although both near-infrared absorbers 305 and 325 are depicted as being positioned completely under light shield 230, in some examples, the near-infrared absorber may extend into active dummy pixel region 225, either displacing or replacing one or more active dummy pixels 227. As only a few rows of optical black dummy pixels are shown in the examples of FIGS. 3A and 3B, it should be understood that optical black dummy pixels may be positioned on opposing lateral sides of the near-infrared absorber, which may extend across the pixel array, and in some examples be trenched to extend into bulk silicon substrate 217 beyond the depth of optical black pixels 237.

Some electrons may be generated through the absorption of photons by the near-infrared absorber. The near-IR absorber may be operated in a drain mode to drain generated electrons and holes. Additionally, dark current may be generated in proximity to the near-IR absorber, some of which is not able to be drained by the near-IR absorber in drain mode alone. To combat this, neighboring rows of pixels may be operated in a drain mode to drain any extraneous electrons (e.g., dark current) from the near-infrared absorber.

Figure 3C:
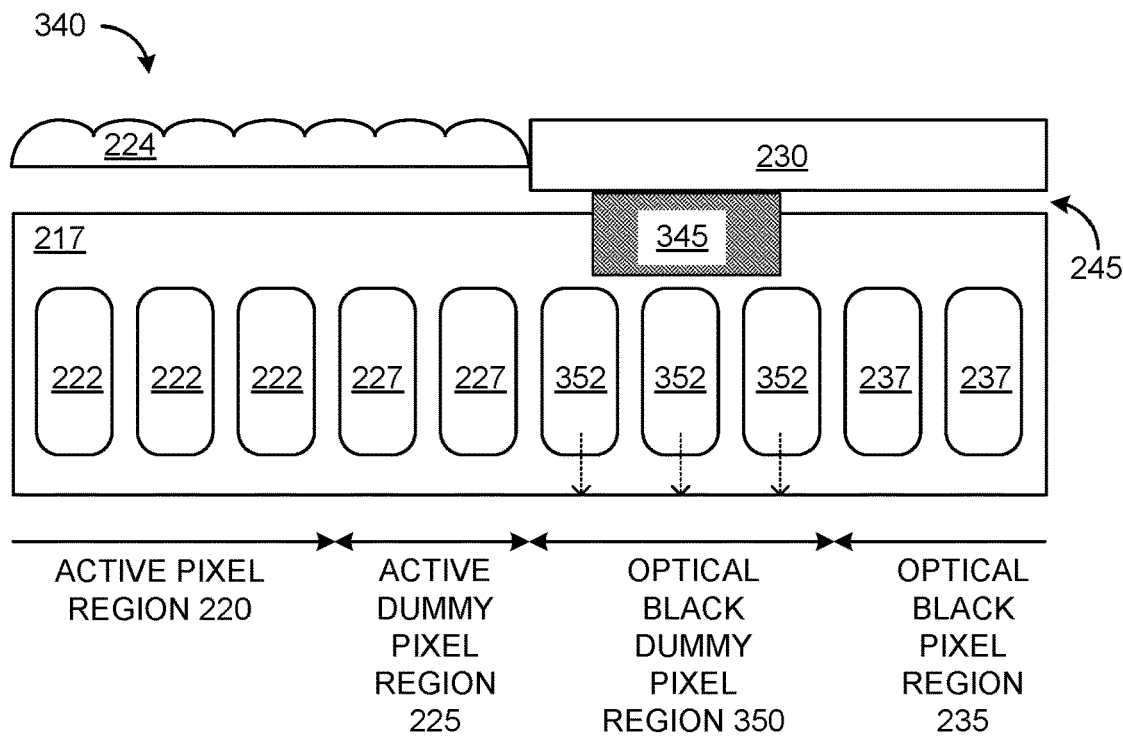
FIGS. 3C-3D schematically show example pixel arrays including a near-infrared absorber flanked by pixels operated in a drain mode.
Figure 3D:
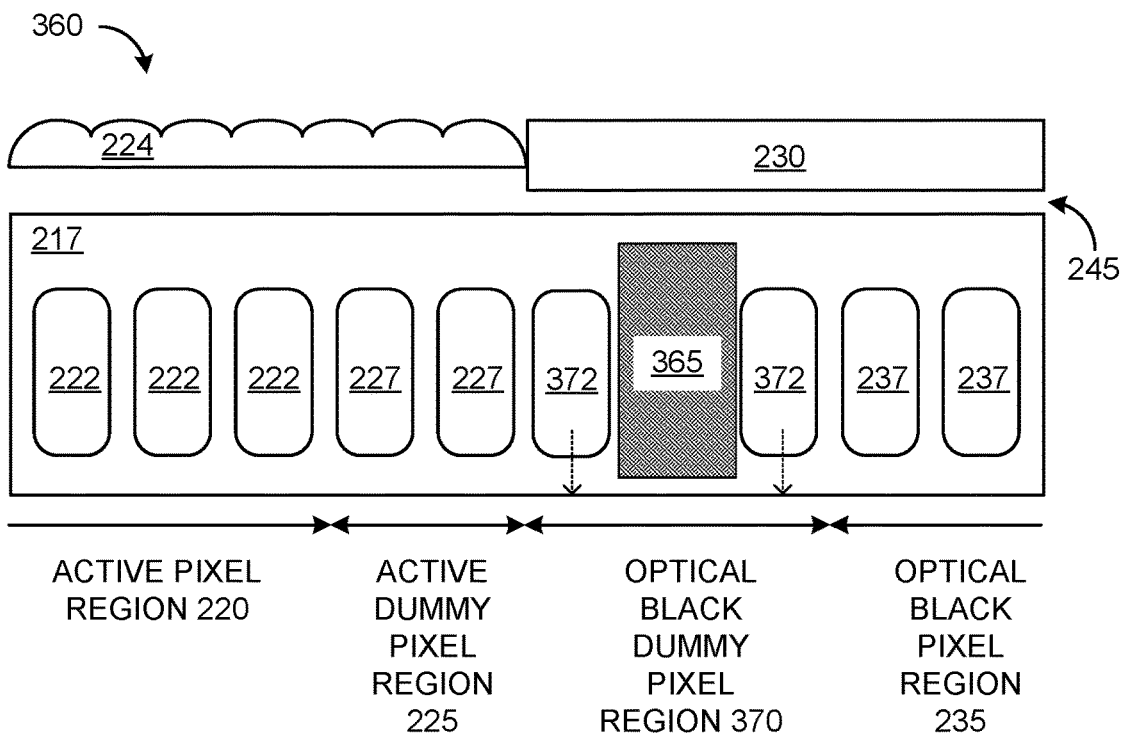

Examples of such configurations are shown in FIGS. 3C and 3D. FIG. 3C schematically shows a cross-section of an example pixel array 340, similar to pixel array 300, including a near-infrared absorber 345 added to the backside of optical black dummy pixel region 350, situated between optical black dummy pixels 352 and opaque light shield 230. In this example, each of the three example rows of optical black dummy pixels 352 that are situated adjacent to near-infrared absorber 345 are operated in drain mode. In FIG. 3D, pixel array 360 includes a near-infrared absorber 365 that is positioned within optical black dummy pixel region 370 so as to be integrated among optical black dummy pixels 372. In this example, the rows of optical black dummy pixels 372 that flank near-infrared absorber 365 are operated in drain mode.

Unlike the near-infrared absorber, the optical black dummy pixels may be connected to power supply voltage, and thus may be operated in drain mode through operation of included transfer gates, reset gates, etc. In the simplified drawings of FIG. 3C and FIG. 3D, all of the illustrated optical black dummy pixels are operated in drain mode. However, depending on the width of the optical black dummy pixel region and the width of the near-infrared absorber, some portions and/or rows of optical black dummy pixels may not be operated in a drain mode. Further, in some examples, bordering rows of active dummy pixels may also be operated in drain mode.

Figures 4A, 4B:
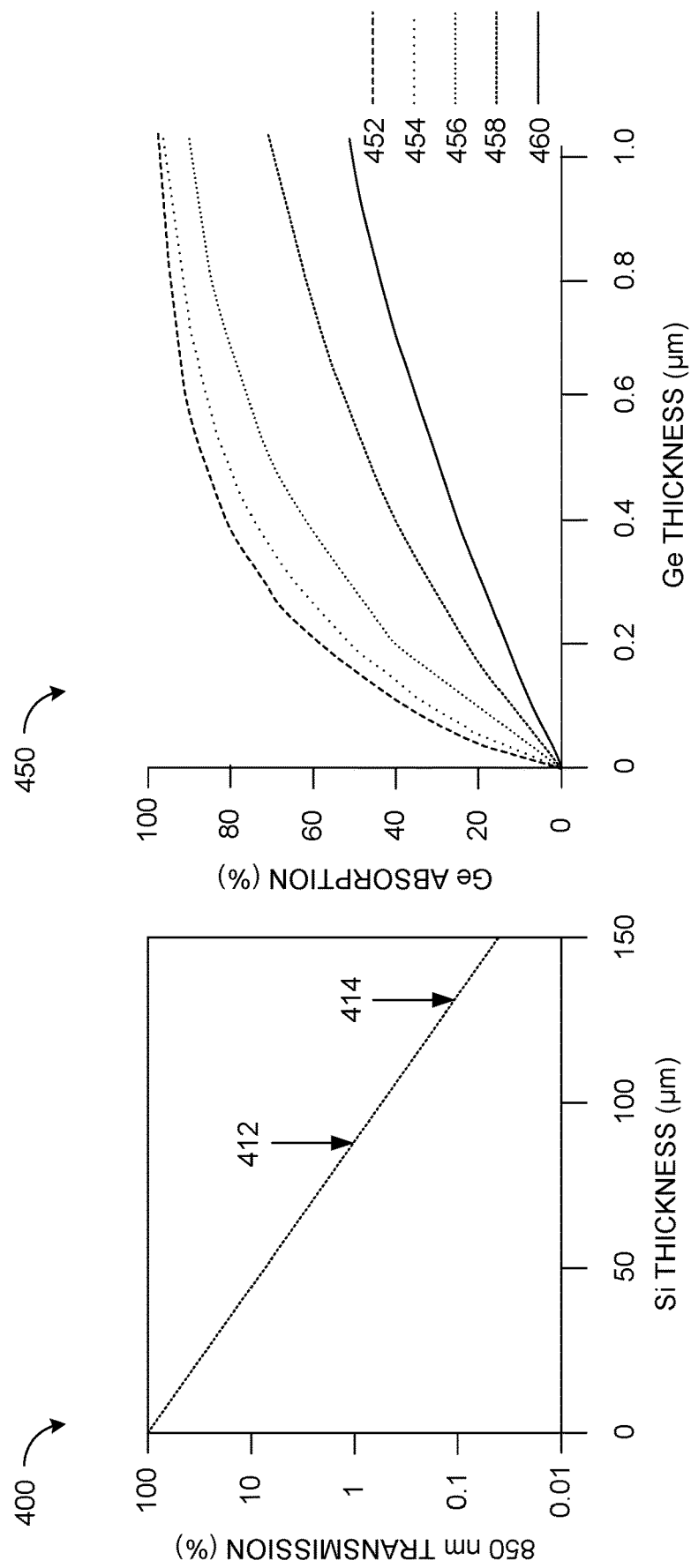
FIG. 4A is a plot indicating absorption of 850 nm light by silicon.
FIG. 4B is a plot indicating absorption of near-infrared light by germanium.

Replacing some of the bulk silicon substrate and silicon-based pixels as shown in FIG. 2, with a more effective near-IR absorption material may be an effective mechanism of reducing the size of a pixel array, as absorption of near-IR photons can be accomplished over a shorter path length. FIG. 4A shows an example plot 400, showing transmission of 850 nm light (as a percentage of total) by silicon over varying thickness (in microns). Given a total (100%) set of photons at the border between an active pixel region and an OB pixel region, an 85 µm silicon buffer provides for 99% absorption (1% transmission) of 850 nm photons, as indicated at 412. Further, 130 µm of spacing provides for 99.9% absorption (0.1% transmission), as indicated at 414.

In contrast, germanium is a relatively efficient absorber of near-IR radiation. FIG. 4B shows an example plot 450 indicating absorption of light (as a percentage of total) by germanium over varying thickness (in µm). Absorption of 850 nm light is shown at 452, absorption of 950 nm light is shown at 454, absorption of 1100 nm light is shown at 456, absorption of 1380 nm light is shown at 458, and absorption of 1550 nm light is shown at 460.

As shown at 452, nearly 100% of 850 nm light is absorbed over 1 µm of germanium. Similarly, 1 µm of germanium is sufficient to absorb 90% or more of 950 nm and 1100 nm light, as shown at 454 and 456, respectively. Although longer wavelengths are less efficiently absorbed, silicon is effectively transparent over these wavelengths, and does not generate photoelectrons that would result in dark current. As such, 1 µm of germanium is highly effective in capturing near-IR wavelengths in the problematic range of 850-1100 nm, and does absorb a significant (~50%) of wavelengths up to 1550 nm, as indicated at 458 and 460.

Incorporating a germanium-based absorption layer is compatible with the BSI-CIS process flow. Such a layer does not need to be crystalline, since the dark current from defects due to interface dislocations can be drained by appropriately biasing the germanium layer. As such, the germanium may be deposited by any suitable method, such as low temperature chemical vapor deposition, physical vapor deposition (PVD), and sputtering methods. By using low-quality germanium, the difference in densities across the near-infrared absorber may be high, and thus recombination may also be high, which may help prevent photocharge from reaching the optical black pixels.

In addition to, or as alternative to, adding a near-infrared absorber to reduce near-infrared photon migration to optical black pixels, a deep trench isolator (DTI) may be added to the pixel array to absorb and/or reflect near-infrared photons. DTIs are used frequently in RGB cameras to prevent bleed and cross-talk between pixels. Here, one or more DTI regions may be established to prevent photons from migrating into the optical black pixel region, thereby acting more as a bleed barrier than as a true pixel isolator.

Figure 5:
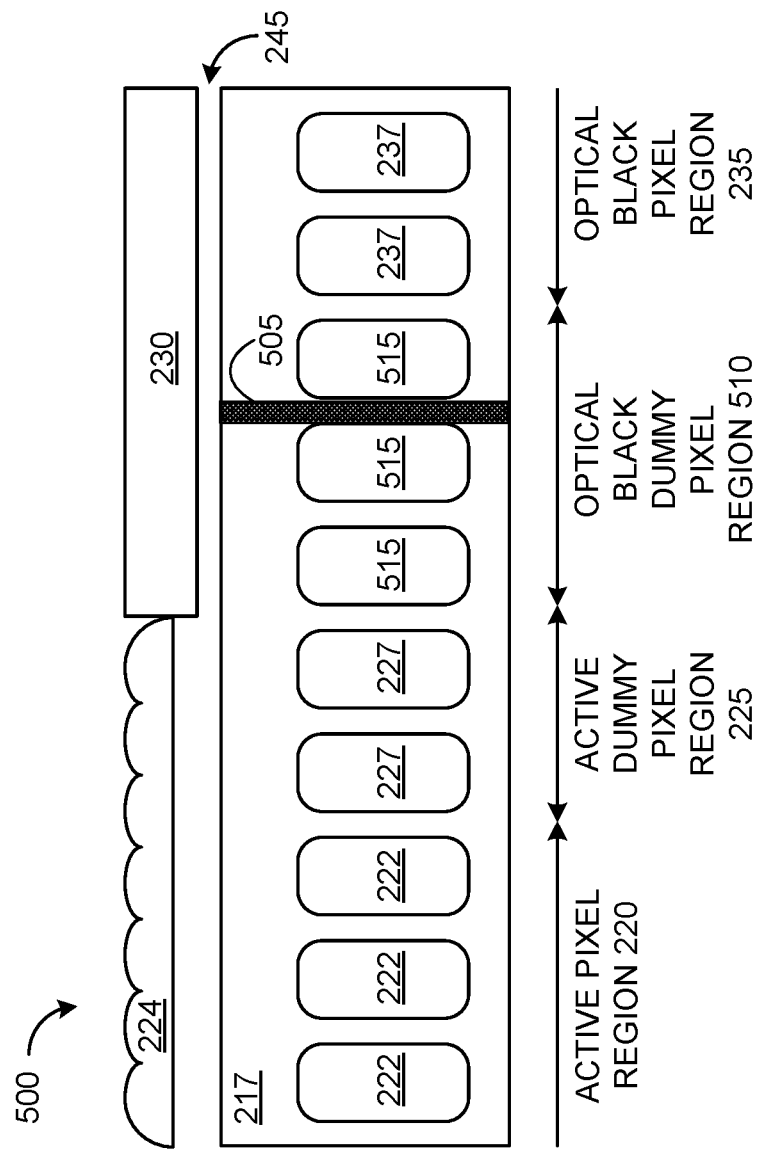
FIG. 5 schematically shows an example pixel array including a deep-trench isolator.

As an example, FIG. 5 schematically shows a cross-section of an example pixel array 500 including a DTI 505 extending between optical black pixel region 235 and active pixel region 220. In this example, DTI 505 is situated within optical black dummy pixel region 510, between rows of optical black dummy pixels 515. However, in other examples, DTI 505 may be positioned between optical black pixel region 235 and optical black dummy pixel region 510, or between optical black dummy pixel region 510 and active dummy pixel region 225. In most examples, DTI 505 is situated beneath light shield 230, but may extend outward into active dummy pixel region 225.

In some examples, the DTI may comprise silicon dioxide within the trench. Silicon dioxide may provide a reduction in photon bleed-in to optical black pixel region 235, as light rays that approach at an angle are reflected due to total internal reflection. In other examples, DTI 505 may be filled or partially filled with a metal, such as tungsten that will block all wavelengths from crossing into optical black pixel region 235. Factors such as the selected metal, the trench shape, and the speed of processing may inform which deposition process is most applicable (e.g., cvd, sputtering).

DTI 505 may be positioned at a distance far enough from active pixel region 220 so that the photons do not merely reflect back to active pixels 222. DTI 505 may effectively double the absorption for silicon, and thus cut the required thickness for absorption in half. In some examples, a partial DTI, e.g., silicon dioxide filled, may be positioned on the backside of active pixel region 220 to further prevent near-IR reflection into active pixels 222.

In other examples, a DTI, such as a metal-filled or partially-metal filled DTI, may be used along with a near-infrared absorber. In this way, the DTI may reflect near-infrared photons back to the infrared absorber for further absorption.

Figure 6A:
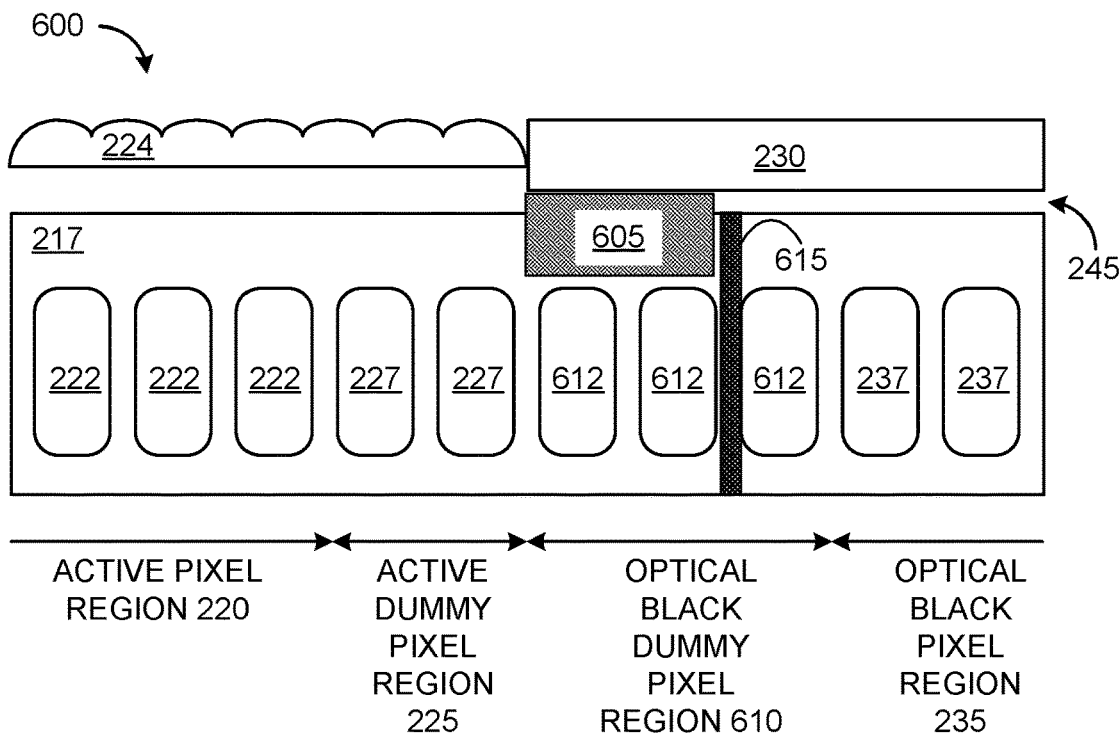
FIGS. 6A-6B schematically show example pixel arrays including both a near-infrared absorber and a deep-trench isolator.

For example, FIG. 6A schematically shows a cross-section of an example pixel array 600 including a near-infrared absorber 605 added to the backside of optical black dummy pixel region 610, situated between optical black dummy pixels 612 and opaque light shield 230, and a DTI 615 positioned between near-infrared absorber 605 and optical black pixel region 235. Pixel array 600 may be considered an example of pixel array 300 shown in FIG. 3A and/or pixel array 340 shown in FIG. 3C. As described with regard to FIG. 3C, optical black dummy pixels 612 adjacent to near-infrared absorber 605 may be operated in a draining mode to remove electrons from near-infrared absorber 605.

Figure 6B:
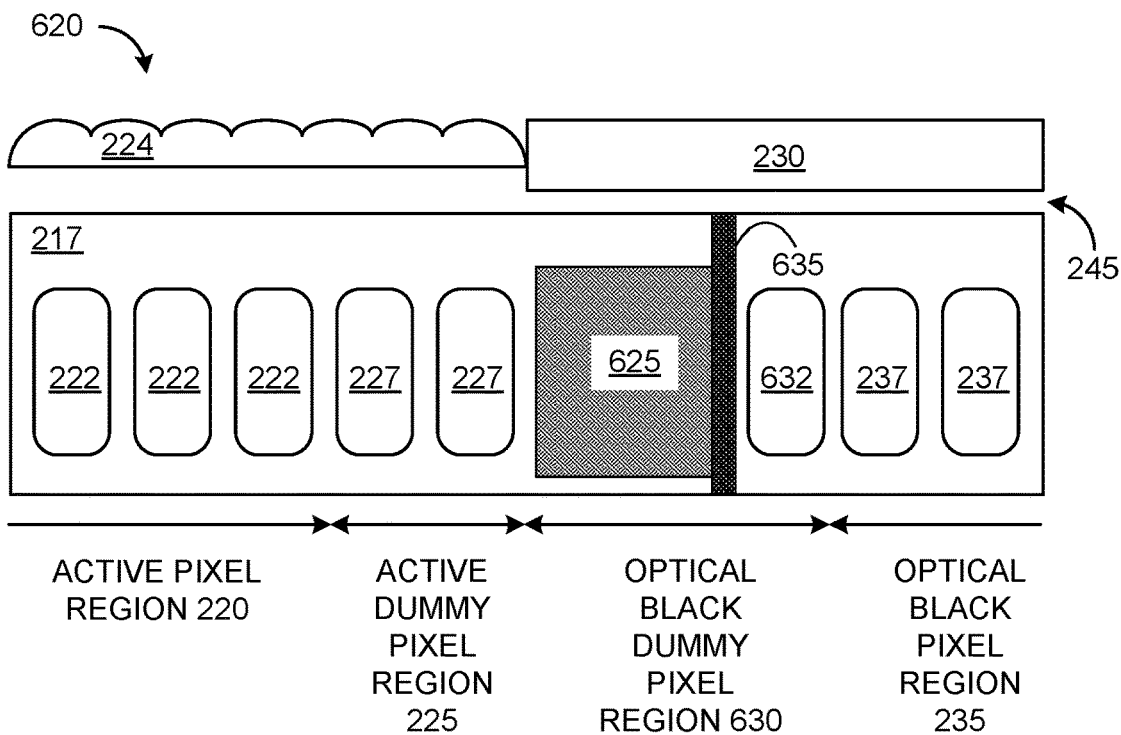

FIG. 6B schematically shows a cross-section of an example pixel array 620 including a near-infrared absorber 625 positioned within optical black dummy pixel region 630 so as to be integrated among optical black dummy pixels 632. A DTI 635 is positioned within optical black dummy pixel region 630 between near-infrared absorber 605 and optical black pixel region 235. Pixel array 620 may be considered an example of pixel array 320 shown in FIG. 3B and/or pixel array 360 shown in FIG. 3D. As described with regard to FIG. 3C, optical black dummy pixels 612 adjacent to near-infrared absorber 605 may be operated in a draining mode to remove electrons from near-infrared absorber 605.

Figure 7:
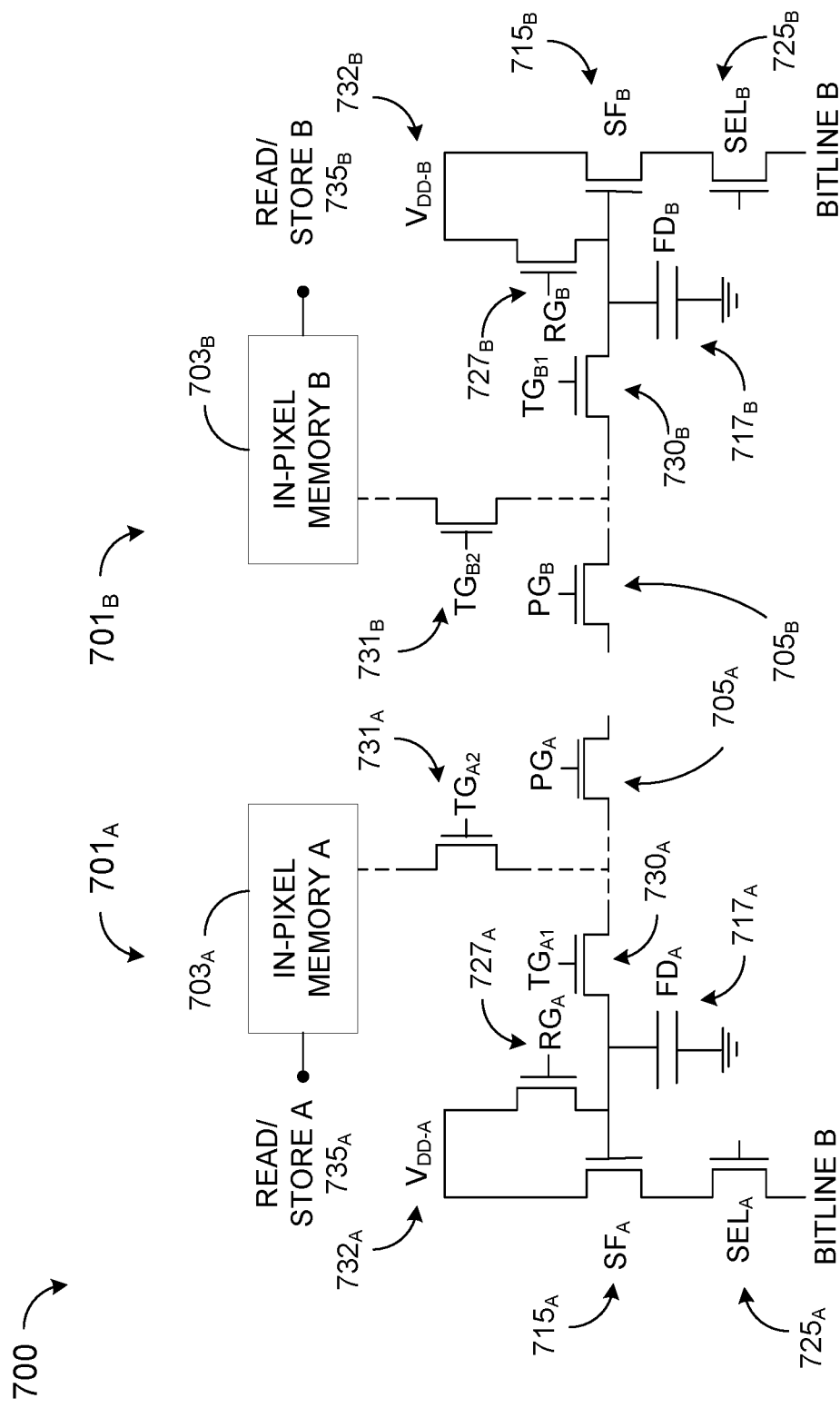
FIG. 7 schematically shows an example circuit for an indirect time-of-flight pixel.

In some implementations, the pixels of the sensor array of FIGS. 3A-3D, 5, and 6A-6B may be multi-tap pixels, such as indirect ToF pixels. FIG. 7 shows an example schematic of an indirect ToF pixel 700, such as a photogate ToF pixel. Indirect ToF pixel 700 includes an "A" circuit 701a and a "B" circuit 701b, each featuring a photogate (705a, PGA; 705b, PGB).

Each of circuits 701a and 701b includes in-pixel memory 703a and 703b, respectively, each configured to store charge generated by a respective photogate during integration. Circuits 701a and 701b also include first transfer gates 730a and 730b ($TG_{A1}$, $TG_{B1}$), and second transfer gates 731a and 731b ($TG_{A2}$, $TG_{B2}$). For example, within circuit 701a, $TG_{A1}$ 730a controls the flow of charge to and from in-pixel memory A 703a, and $TG_{A2}$ 731a controls the flow of charge between in-pixel memory 703a and floating diffusion capacitor $FD_A$ 717a for readout as a voltage across source follower $SF_A$ 715a by operation of row select transistor $SEL_A$ 725$_A$. Circuit 701b operates similarly.

Circuits 701a and 701b thus each include passive elements, such as source followers 715a and 715b ($SF_A$, $SF_B$), and floating diffusion capacitors 717a and 717b ($FD_A$, $FD_B$). Each of circuits 701a and 701b also include actuatable elements such as row select transistors 725a and 725b ($SEL_A$, $SEL_B$), reset gates 727a and 727b ($RG_A$, $RG_B$), first transfer gates 730a and 730b ($TG_A$, $TG_B$), and second transfer gates 731a and 731b. Selective operation of each gate under a clocking signal determines where within indirect ToF pixel 700 charge integrates over time (e.g., $V_{DD-A}$ 732a, $V_{DD-B}$ 732b, In-pixel memory A 703a, In-pixel memory B 703b) and when that accumulated charge is read out at collection nodes 735a and 735b (READ/STORE A, READ/STORE B). Based on the electrical conditions within the photodiode assembly, the pixel controller may determine a pixel value for an image, and/or report data to a separate processing element useable to determine the pixel value.

Such an indirect ToF pixel, or any demodulation pixel having at least 2 taps, can be used for 2D imaging by allocating most of the duty cycle to one of the photogates. Advantageously, the dark signal for the tap having the shortest duty cycle (and/or the lowest responsivity) can be utilized for the dark offset cancellation. For example, PGA 705A could receive 99.9% duty cycle, while PGB 705B could receive the remaining 0.1% duty cycle. In such a configuration, PGA 705A would collect the vast majority of photoelectrons, while PGB 705B would produce negligible signal upon integration.

Further, the light responsivity is modulated by the pixel modulation contrast. As such, the light signal can be significantly attenuated (e.g., 19:1 modulation contrast/light responsivity), while dark offset cancellation is still feasible. This is due to the dark current ratio between taps not following either the duty cycle trend or the light responsivity trend. Rather, the dark current ratio between taps is a predetermined value (e.g., 1.5:1, as an illustrative example). The dark current ratio may be computed and/or determined empirically, and may be based on factors such as differences in gate interfaces, from differences in bulk silicon, etc. For example, the high duty cycle photogate may have more depletion in bulk silicon and thus more volume. As such, a conversion factor may be applied to the dark current signal from the low duty cycle photogate to equate with the dark current signal from the high duty cycle photogate.

Once this dark current ratio is established, then by measuring the low duty cycle photogate in the optical black pixels, the dark current for the high duty cycle photogates in active pixels may be estimated. Since the light responsivity ratio is relatively high, even if there is some photoleakage into the optical black pixel region, the difference in modulation contrast ensures that the light signal is attenuated. As such, the dark current can be measured with low responsivity by sampling at the low duty cycle photogate.

Figure 8:
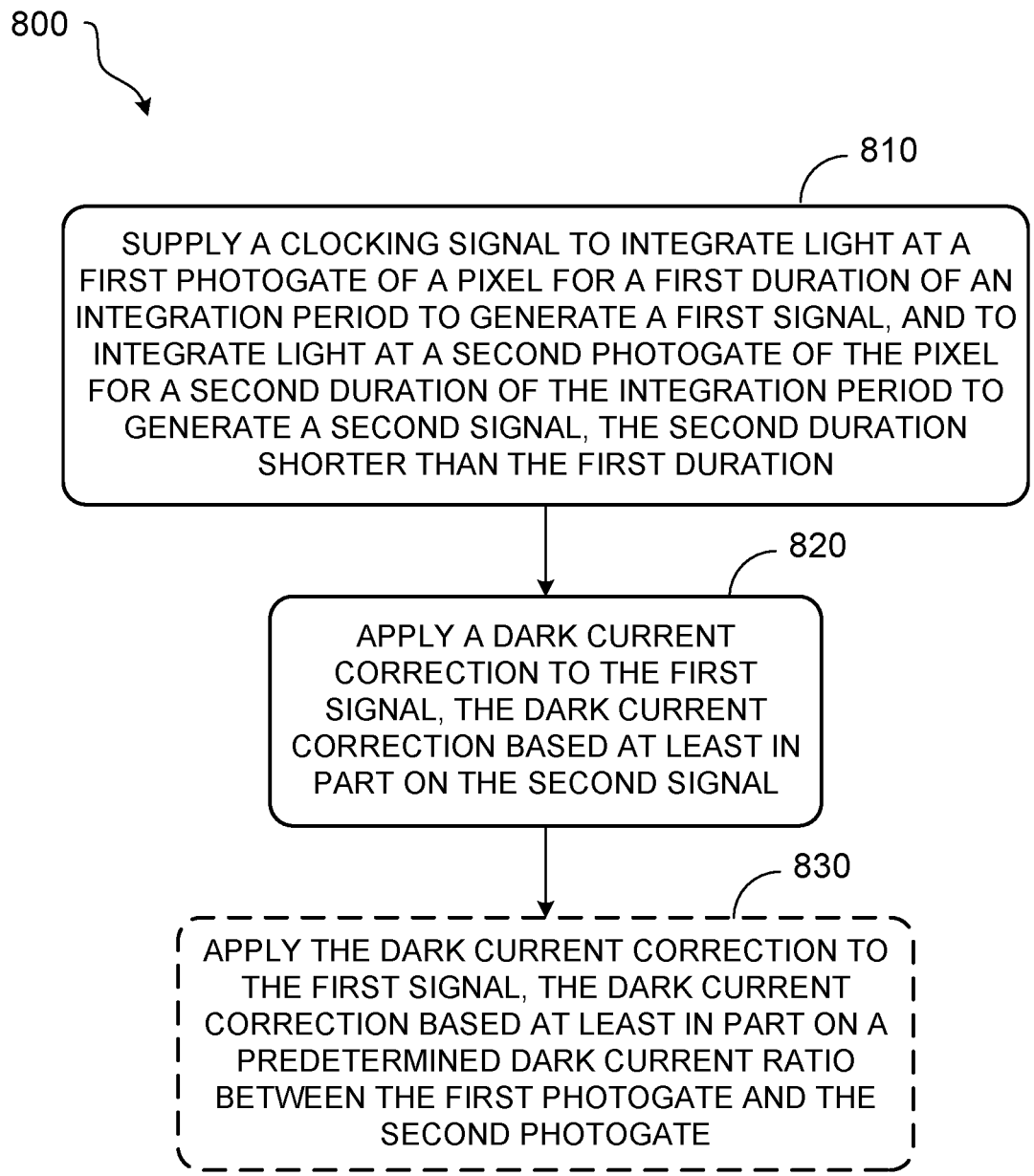
FIG. 8 shows an example method for operating a multi-tap pixel in order to cancel out dark current.

FIG. 8 is an example method 800 for operating a multi-tap pixel. For example, method 800 may be applied to correct for dark current in an output signal of a pixel. In some examples, the multi-tap pixel is an indirect time-of-flight pixel or other photogate pixel, such as pixel 700.

At 810, method 800 includes supplying a clocking signal to integrate light at a first photogate of a pixel for a first duration of an integration period to generate a first signal, and to integrate light at a second photogate of the pixel for a second duration of the integration period to generate a second signal, the second duration shorter than the first duration. As the first photogate will be integrating light for a longer duration than the second photogate, it follows that more photoelectrons will integrate at the first photogate than at the second photogate over the integration period.

In some examples, the second duration is less than one percent of the integration period, and the first duration is greater than 99 percent of the integration period. In some examples, the second photogate may not be deliberately integrated at all (e.g., not provided a clocking signal to integrate), even though some signal may accumulate at the second photogate during the integration period due to shunting of signal between the first and second photogates.

In some examples, the first photogate and the second photogate may be included in separate pixels. For example, a first photogate of a first pixel may be included in an active pixel array, while a second photogate of a second pixel may be included in an optical black pixel array.

The light signal at the second photogate may be attenuated relative to a light signal at the first photogate. As an example, the light signal at the second photogate may be attenuated to less than 10 percent of the light signal of the first photogate.

At 820, method 800 includes applying a dark current correction to the first signal, the dark current correction based at least in part on the second signal. For example, at least the second signal may be subtracted from the first signal. The dark current correction may be based on the first photogate and the second photogate having similar dark currents, or at least dark currents that are relatable through a function. At 830, method 800 optionally includes applying the dark current correction to the first signal, the dark current correction being further based at least in part on a predetermined dark current ratio between the first photogate and the second photogate.

Figure 9:
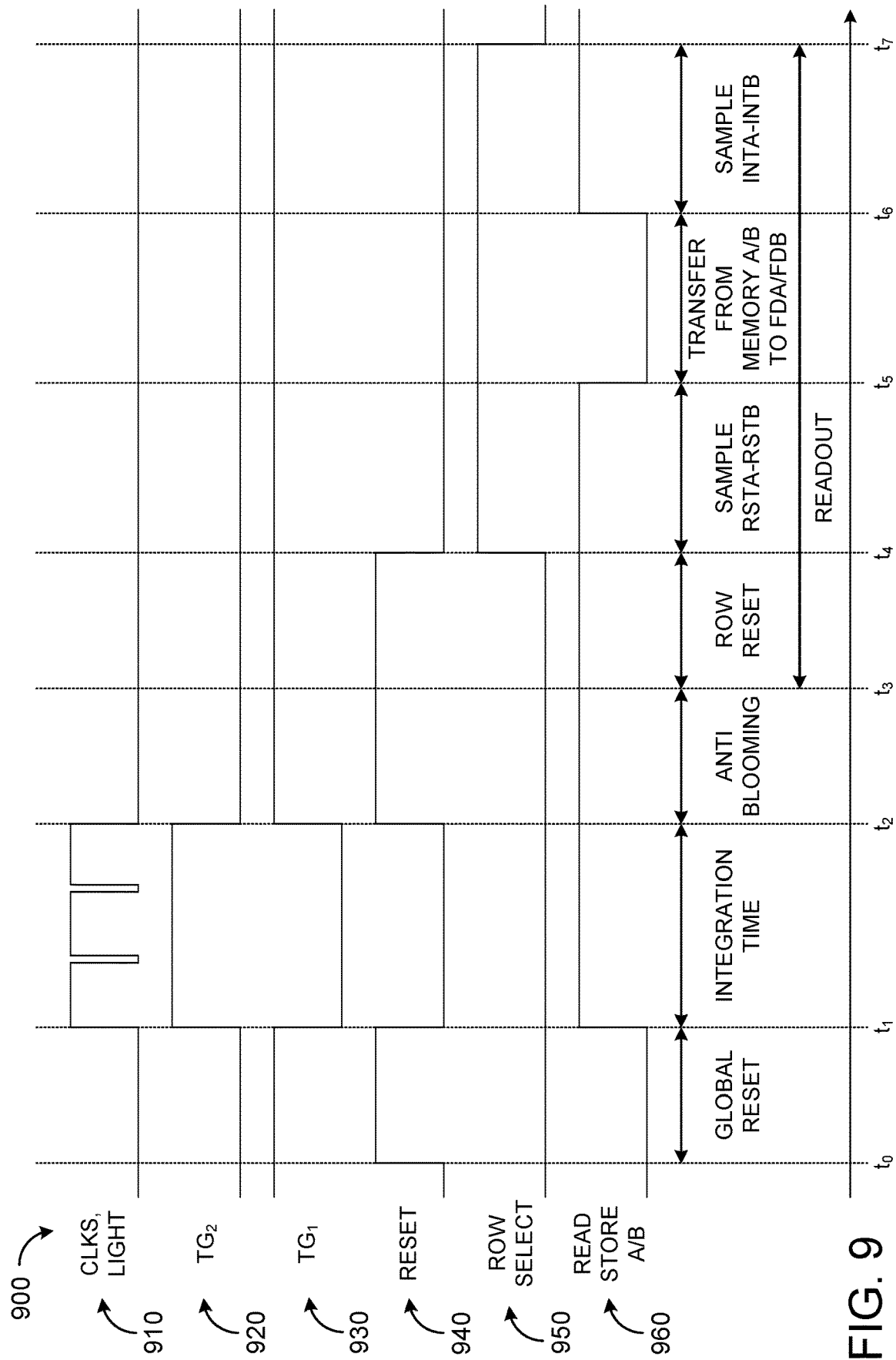
FIG. 9 shows a timing plot for operating an indirect time-of-flight pixel using the method of FIG. 8.

FIG. 9 shows a timing plot 900 for operating an indirect time-of-flight pixel using method 800. Timing plot 900 will be described with reference to indirect time-of-flight pixel 700, however, similar timing plots may also be applied to similar multi-tap pixels.

Plot 910 (CLKS, LIGHT) shows a clocking signal applied to select one of a first or second photogate to be an active photogate. In this example, the clocking signal is applied to select or not select the first photogate. A complementary signal is applied to the second photogate during integration time. Plot 920 (TG2) indicates shows a status of second transfer gates $TG_{A2}$ $731_A$ and $TG_{B2}$ $731_B$; either activated (high signal) or deactivated (low signal). Plot 930 (TG1) shows a status of first transfer gates $TG_{A1}$ $730_A$ and $TG_B$ $730_B$; either activated (high signal) or deactivated (low signal). Plot 940 (RESET) shows a status of reset gates $RG_A$ $727_A$ and $RG_B$ $727_B$; either activated (high signal) or deactivated (low signal). Plot 950 (ROW SELECT) shows a status of row select gates $SEL_A$ $725_A$ and $SEL_B$ $725_B$; either activated (high signal) or deactivated (low signal). Plot 960 shows a status of READ/STORE A $735_A$ and READ/STORE B $735_B$, indicating whether or not in-pixel memory A and B are being held (high signal) or drained to floating diffusion capacitors $FD_A$ $717_A$ and $FD_B$ $717_B$ (low signal).

From time $t_0$ to time $t_1$, the pixel is operated in a global reset mode. As such, the reset gates are activated, as shown by plot 940, and the first transfer gates are activated, as shown by plot 930.

From time $t_1$ to time $t_2$, the pixel is operated for an integration time period. As such, the second transfer gates are activated, as shown by plot 920. The clocking signal, as shown by plot 910 is applied to the first tap for the majority of the integration time period, and to the second tap for a shorter portion of the integration time period, as described with regard to FIG. 8 at 810. The READ/STOREs are operated in storage mode. From time $t_2$ to time $t_3$, the pixel is operated in an anti-blooming mode to prevent signal spillover, wherein the second transfer gates are deactivated, and the reset gates and first transfer gates are activated. No clock signal is applied.

From time $t_3$ to time $t_7$, the pixel is operated in a readout mode. From time $t_3$ to time $t_4$, the pixel is operated in a row reset mode, wherein reset gates and first transfer gates remain actuated, and the row selects are deactivated, as shown at 950. From time $t_4$ to time $t_5$, the pixel is operated in a reset sampling mode. The row selects are activated, the reset gates are closed, and signal is sampled from the reset gates. From time $t_5$ to time $t_6$, the pixel is operated in a transfer mode, wherein charge is transferred from in-pixel memory to floating diffusion. Then, from time $t_6$ to time $t_7$, the pixel is operated in an integration sampling mode, where the transferred integrated signal is sampled. In this way, light and dark current from the first photodiode is sampled, and dark current is sampled from the second photodiode. Based on the dark current conversion, a dark current offset can be determined and subtracted from the total current at the first photodiode to generate a dark current corrected signal.

In some embodiments, the methods and processes described herein may be tied to a computing system of one or more computing devices. In particular, such methods and processes may be implemented as a computer-application program or service, an application-programming interface (API), a library, and/or other computer-program product.

Figure 10:
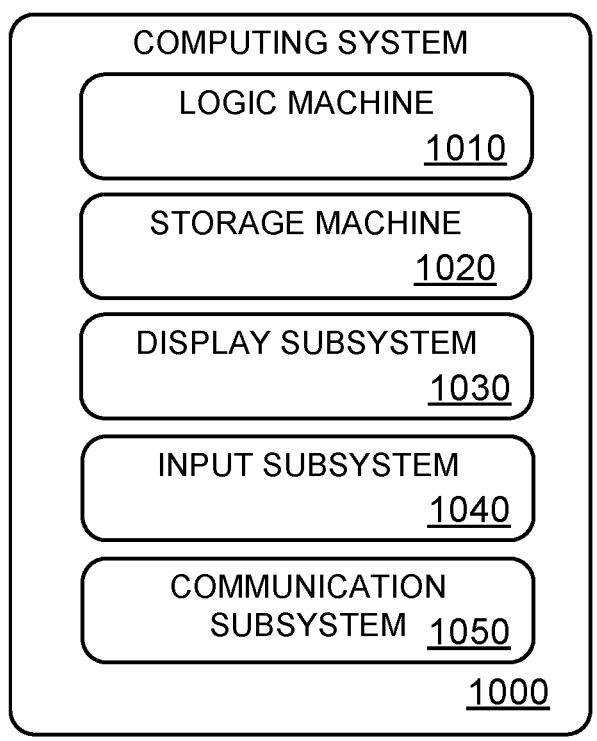
FIG. 10 schematically shows an example computing system.

FIG. 10 schematically shows a non-limiting embodiment of a computing system 1000 that can enact one or more of the methods and processes described above. Computing system 1000 is shown in simplified form. Computing system 1000 may take the form of one or more personal computers, server computers, tablet computers, home-entertainment computers, network computing devices, gaming devices, mobile computing devices, mobile communication devices (e.g., smart phone), and/or other computing devices.

Computing system 1000 includes a logic machine 1010 and a storage machine 1020. Computing system 1000 may optionally include a display subsystem 1030, input subsystem 1040, communication subsystem 1050, and/or other components not shown in FIG. 10.

Logic machine 1010 includes one or more physical devices configured to execute instructions. For example, the logic machine may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic machine may include one or more processors configured to execute software instructions. Additionally or alternatively, the logic machine may include one or more hardware or firmware logic machines configured to execute hardware or firmware instructions. Processors of the logic machine may be single-core or multi-core, and the instructions executed thereon may be configured for sequential, parallel, and/or distributed processing. Individual components of the logic machine optionally may be distributed among two or more separate devices, which may be remotely located and/or configured for coordinated processing. Aspects of the logic machine may be virtualized and executed by remotely accessible, networked computing devices configured in a cloud-computing configuration.

Storage machine 1020 includes one or more physical devices configured to hold instructions executable by the logic machine to implement the methods and processes described herein. When such methods and processes are implemented, the state of storage machine 1020 may be transformed—e.g., to hold different data.

Storage machine 1020 may include removable and/or built-in devices. Storage machine 1020 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage machine 1020 may include volatile, nonvolatile, dynamic, static, read/write, read-only, random-access, sequential-access, location-addressable, file-addressable, and/or content-addressable devices.

It will be appreciated that storage machine 1020 includes one or more physical devices. However, aspects of the instructions described herein alternatively may be propagated by a communication medium (e.g., an electromagnetic signal, an optical signal, etc.) that is not held by a physical device for a finite duration.

Aspects of logic machine 1010 and storage machine 1020 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 1030 may be used to present a visual representation of data held by storage machine 1020. This visual representation may take the form of a graphical user interface (GUI). As the herein described methods and processes change the data held by the storage machine, and thus transform the state of the storage machine, the state of display subsystem 1030 may likewise be transformed to visually represent changes in the underlying data. Display subsystem 1030 may include one or more display devices utilizing virtually any type of technology. Such display devices may be combined with logic machine 1010 and/or storage machine 1020 in a shared enclosure, or such display devices may be peripheral display devices.

When included, input subsystem 1040 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 1050 may be configured to communicatively couple computing system 1000 with one or more other computing devices. Communication subsystem 1050 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 1000 to send and/or receive messages to and/or from other devices via a network such as the Internet.

In another example, an imaging sensor comprises a bulk silicon substrate; a pixel array comprising: an active pixel region including a subarray of active pixels, an optical black pixel region including a subarray of optical black pixels, and an optical black dummy pixel region including a subarray of optical black dummy pixels, the optical black dummy pixel region positioned between the active pixel region and the optical black pixel region; and a near-infrared absorber positioned between the active pixel region and the optical black pixel region, the near-infrared absorber comprising a material having a higher near-infrared absorption coefficient than that of silicon. In such an example, or any other example, the near-infrared absorber additionally or alternatively comprises germanium. In any of the preceding examples, or any other example, the near-infrared absorber is additionally or alternatively positioned between pixels of the optical black dummy pixel subarray and an opaque light shield. In any of the preceding examples, or any other example, the near-infrared absorber is additionally or alternatively integrated among pixels of the optical black dummy pixel subarray. In any of the preceding examples, or any other example, pixels of the optical black dummy pixel subarray adjacent to the near-infrared absorber are additionally or alternatively operated in a drain mode. In any of the preceding examples, or any other example, the near-infrared absorber is additionally or alternatively not connected to a power supply voltage. In any of the preceding examples, or any other example, the pixel array additionally or alternatively includes an active dummy pixel region including a subarray of active dummy pixels positioned between the subarray of active pixels and the subarray of optical black dummy pixels.

In another example, an imaging sensor comprises a pixel array comprising: an active pixel region including an active pixel subarray, an optical black pixel region including an optical black pixel subarray, and an optical black dummy pixel region including an optical black dummy pixel subarray, the optical black dummy pixel region positioned between the active pixel region and the optical black pixel region; and a deep trench isolator extending between the optical black pixel region and the active pixel region. In such an example, or any other example, the deep trench isolator is additionally or alternatively at least partially filled with an oxide. In any of the preceding examples, or any other example, the deep trench isolator is additionally or alternatively at least partially filled with a metal. In any of the preceding examples, or any other example, the deep trench isolator is additionally or alternatively positioned within the optical black dummy pixel region. In any of the preceding examples, or any other example, the imaging sensor additionally or alternatively comprises a bulk silicon substrate; and a near-infrared absorber positioned between the active pixel subarray and deep trench isolator, the near-infrared absorber fabricated from a material having a higher near-infrared absorption coefficient than that of silicon. In any of the preceding examples, or any other example, the near-infrared absorber additionally or alternatively comprises germanium. In any of the preceding examples, or any other example, the near-infrared absorber is additionally or alternatively positioned between the optical black dummy pixel subarray and an opaque light shield. In any of the preceding examples, or any other example, the near-infrared absorber is additionally or alternatively integrated among pixels of the optical black dummy pixel subarray.

In yet another example, a method for operating a multi-tap pixel comprises supplying a clocking signal to integrate light at a first photogate of a pixel for a first duration of an integration period to generate a first signal, and to integrate light at a second photogate of the pixel for a second duration of the integration period to generate a second signal, the second duration shorter than the first duration; and applying a dark current correction to the first signal, the dark current correction based at least in part on the second signal. In such an example, or any other example, the dark current correction is additionally or alternatively based at least in part on a predetermined dark current ratio between the first photogate and the second photogate. In any of the preceding examples, or any other example, a light signal at the second photogate is additionally or alternatively attenuated relative to a light signal at the first photogate. In any of the preceding examples, or any other example, the second duration is additionally or alternatively less than one percent of the integration period. In any of the preceding examples, or any other example, the pixel is additionally or alternatively an indirect time-of-flight pixel.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An imaging sensor, comprising:
  a bulk silicon substrate;
  a pixel array comprising:
    an active pixel region including a subarray of active multi-tap pixels,
    an optical black pixel region including a subarray of optical black multi-tap pixels, and
    an optical black dummy pixel region including a subarray of optical black dummy pixels, the optical black dummy pixel region positioned between the active pixel region and the optical black pixel region;
  a near-infrared absorber positioned between the active pixel region and the optical black pixel region, the near-infrared absorber comprising a material having a higher near-infrared absorption coefficient than that of silicon; and
  a controller configured to
    supply a clocking signal to integrate light at a first tap of an optical black multi-tap pixel of the subarray of optical black multi-tap pixels to generate a first signal, and to integrate light at a second tap of the optical black multi-tap pixel to generate a second signal; and
    apply a dark current correction to an active multi-tap pixel of the subarray of active multi-tap pixels based at least in part on the second signal.

2. The imaging sensor of claim 1, wherein the near-infrared absorber comprises germanium.

3. The imaging sensor of claim 1, wherein the near-infrared absorber is positioned between pixels of the optical black dummy pixel subarray and an opaque light shield.

4. The imaging sensor of claim 1, wherein the near-infrared absorber is integrated among pixels of the optical black dummy pixel subarray.

5. The imaging sensor of claim 1, wherein pixels of the optical black dummy pixel subarray adjacent to the near-infrared absorber are operated in a drain mode.

6. The imaging sensor of claim 1, wherein the near-infrared absorber is not connected to a power supply voltage.

7. The imaging sensor of claim 1, wherein the pixel array further includes an active dummy pixel region including a subarray of active dummy pixels positioned between the subarray of active multi-tap pixels and the subarray of optical black dummy pixels.

8. An imaging sensor, comprising:
  a pixel array comprising:
    an active pixel region including an active multi-tap pixel subarray,
    an optical black pixel region including an optical black multi-tap pixel subarray, and
    an optical black dummy pixel region including an optical black dummy pixel subarray, the optical black dummy pixel region positioned between the active pixel region and the optical black pixel region;
  a deep trench isolator extending between the optical black pixel region and the active pixel region; and
  a controller configured to
    supply a clocking signal to integrate light at a first tap of an optical black multi-tap pixel of the subarray of optical black multi-tap pixels to generate a first signal, and to integrate light at a second tap of the optical black multi-tap pixel to generate a second signal; and
    apply a dark current correction to an active multi-tap pixel of the subarray of active multi-tap pixels based at least in part on the second signal.

9. The imaging sensor of claim 8, wherein the deep trench isolator is at least partially filled with an oxide.

10. The imaging sensor of claim 8, wherein the deep trench isolator is at least partially filled with a metal.

11. The imaging sensor of claim 8, wherein the deep trench isolator is positioned within the optical black dummy pixel region.

12. The imaging sensor of claim 8, further comprising:
a bulk silicon substrate; and
a near-infrared absorber positioned between the active pixel region and deep trench isolator, the near-infrared absorber fabricated from a material having a higher near-infrared absorption coefficient than that of silicon.

13. The imaging sensor of claim 8, wherein the near-infrared absorber comprises germanium.

14. The imaging sensor of claim 8, wherein the near-infrared absorber is positioned between the optical black dummy pixel subarray and an opaque light shield.

15. The imaging sensor of claim 8, wherein the near-infrared absorber is integrated among pixels of the optical black dummy pixel subarray.

16. A method for operating a multi-tap pixel, comprising:
supplying a clocking signal to integrate light at a first photogate of a pixel for a first duration of an integration period to generate a first signal, and to integrate light at a second photogate of the pixel for a second duration of the integration period to generate a second signal, the second duration shorter than the first duration; and applying a dark current correction to the first signal, the dark current correction based at least in part on the second signal, wherein the dark current correction is further based at least in part on a predetermined dark current ratio between the first photogate and the second photogate.

17. The method of claim 16, wherein a light signal at the second photogate is attenuated relative to a light signal at the first photogate.

18. The method of claim 16, wherein the second duration is less than one percent of the integration period.

19. The method of claim 16, wherein the pixel is an indirect time-of-flight pixel.

* * * * *